US005475246A

United States Patent [19]
Wei et al.

[11] Patent Number: 5,475,246
[45] Date of Patent: Dec. 12, 1995

[54] REPAIR LINE STRUCTURE FOR THIN FILM ELECTRONIC DEVICES

[75] Inventors: Ching-Yeu Wei; Roger S. Salisbury; Robert F. Kwasnick, all of Schenectady, N.Y.

[73] Assignee: General Electric Company, Schenectady, N.Y.

[21] Appl. No.: 169,290

[22] Filed: Dec. 20, 1993

[51] Int. Cl.$^6$ .............................. H01L 27/10; H01L 27/15
[52] U.S. Cl. .............................. 257/291; 257/59; 257/72; 257/642; 437/923
[58] Field of Search .................................. 257/52, 59, 72, 257/291, 292, 642, 643; 437/923; 359/54, 88

[56] References Cited

U.S. PATENT DOCUMENTS 4,723,197  2/1988  Takier et al. .............................. 257/643

Primary Examiner—Sara W. Crane
Attorney, Agent, or Firm—Donald S. Ingraham; Marvin Snyder

[57] ABSTRACT

Repair lines in an imager device include protective layers disposed over steps in the repair lines where the repair lines extend over underlying components in the imager array. The protective layers each include a layer of polyimide to provide protection for the step portions of the conductive repair line from etchants and the like to which the conductive line is exposed during fabrication processes for the imager array. The protective layers are disposed over the steps of a conductive line in a repair crossover region so as to provide a repair area free from the protective material of the protective layers disposed thereon in the repair crossover region where the conductive repair line is disposed in vertical alignment with an underlying address line.

16 Claims, 4 Drawing Sheets

5,475,246

REPAIR LINE STRUCTURE FOR THIN FILM ELECTRONIC DEVICES

BACKGROUND OF THE INVENTION

This invention relates generally to thin film electronic display or imager devices and more particularly to repair line structures contained in devices such as solid state radiation imagers having a matrix of electrically conductive address lines for controlling the active components of the device.

Address lines for conducting electrical signals to and from active components in a display or imager device are formed as integral parts of the structure of solid state imagers. These address lines usually form a matrix, with lines running in one direction designated as scan lines and lines disposed in a substantially perpendicular direction designated as data lines. Electrical signals (e.g. the voltage) on a scan line typically control a switching device, such as a field effect transistor (FET, also referred to as a thin film transistor, or TFT), that in turn couples the active component, such as a photosensor, to the data line so that an electrical signal from the photosensor (corresponding to the number of detected photons incident on the array) can be read out. The resultant signals are then used to electronically reproduce an image of the photons detected by the array of photosensors. In a display device comprising, for example, an array of liquid crystal display devices (LCDs), a similar address line structure is used.

A defect on a scan or data line can adversely affect overall performance of the thin film imager device. For example, an open circuit condition can disable active components connected to the address line beyond the point where the open circuit exists. A short circuit between a data and a scan line can also lead to inaccurate signals being applied to switching transistors connected to either of the shorted data or scan lines. In either case, multiple pixels in the device can be affected, thereby significantly diminishing its resolution. A device having defective address lines may have to be discarded, depending upon the degradation of the resolution of the display device resulting from the inoperative pixels resulting.

Given the expense of fabricating thin film electronic imager devices, it is desirable to have devices that are repairable at various points in the repair process. In one approach, a thin film display device has several auxiliary conductive lines disposed across the transmission lines on the sides of the device, usually outside the active areas of the device. See, e.g., U.S. Pat. No. 4,688,896, assigned to the assignee of the present invention, and which is incorporated herein by reference. In the display device described in that patent, bypassing an open circuit in a defective address line requires that one auxiliary (or repair) line be connected to the defective line at one side of the device (such as by laser welding the two lines together at a point where the lines cross over one another) and that a second auxiliary line be connected to the defective line on the other side of the device. The auxiliary lines are electrically connected by a jumper or the like, allowing the signal to be applied to the defective line on both sides of the open circuit condition.

These auxiliary (or repair) lines are typically formed as a part of the the fabrication process of the photosensor array, which includes the formation of address lines for the photosensor array and the photosensors. The repair lines are typically disposed along the edges of the array oriented perpendicularly to the address lines that extend from the array towards that edge of the array so that the repair lines are disposed in vertical alignment with a portion of respective address lines at crossover regions. The repair lines are typically electrically insulated from the address lines by dielectric material used in the fabrication of the FETs.

The conductive line and dielectric material covering it disposed on top of the crossover region is susceptible to damage in the processing steps that follow the deposition of the upper conductive lines, such as the deposition and patterning of the following components: TFT passivation layer, photodiode island, photodiode dielectric, common electrode, and barrier layer. The etching steps in this processing can result in the repair line being cut at the repair crossover, thereby rendering the repair line ineffective for use with the underlying address line, and, dependent on where the break in the repair line occurs, the entire repair line may be rendered nonfunctional. In particular, the edges of the repair line are most prone to damage during these processing steps.

As imager devices become larger, with increased numbers of scan and data lines, and as higher resolution is required of the device as a whole, fewer inoperative pixels can be tolerated. It is desirable that an imager assembly have multiple repair lines available that can be readily welded to a defective address line to effect a repair.

It is accordingly an object of this invention to provide a thin film electronic imager device structure having repair crossovers that are resistant to damage from device fabrication processes.

It is another object of the present invention to provide a durable thin film electronic device repair structure that readily provides for repair of the device.

SUMMARY OF THE INVENTION

In accordance with this invention a thin film electronic imager device includes a plurality of conductive address lines, for example, scan lines oriented along a first axis and data lines oriented along a second axis, the second axis being substantially perpendicular to the first axis, so as to form a matrix arrangement. In the device, at least one conductive line comprises a repair line that is disposed along an orientation substantially perpendicular to the address line that it is desired to be able to repair and such that the repair line is in vertical alignment with the address line at a crossover region.

For example, a first conductive line is oriented along the first axis and a second conductive line is oriented along the second axis such that the second line is in vertical alignment with the first line at a respective repair crossover region. A dielectric layer is disposed between the first and second conductive lines at the repair crossover. The second conductive line is disposed so that it substantially conforms to the topography of underlying components disposed on the substrate and such that the line has a plurality of steps therein disposed in correspondence with locations where the second conductive line extends over surface features of the topography. Respective first and second protective layers are disposed over selected steps of the second conductive line, the protective layers being disposed to cover edge portions of the step (that is the upper surface of the second conductive line where it bends to conform with the underlying surface topography) such that a repair area is disposed between the first and second protective layers. The repair area comprises an area in which substantially no material of the respective protective layers is disposed on the second conductive line in a portion of the crossover region in which the second conductive line is in vertical alignment with the underlying first conductive line.

First and second protective layers each typically comprise an organic dielectric material, such as polyimide, that provides protection for the underlying second conductive line material from etchants and the like to which the second conductive line is otherwise exposed during the fabrication of the imager.

In another embodiment, a third protective layer, comprising, e.g., an inorganic dielectric such as silicon nitride, is disposed over the first and second protective layers and the repair area of the repair crossover region.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
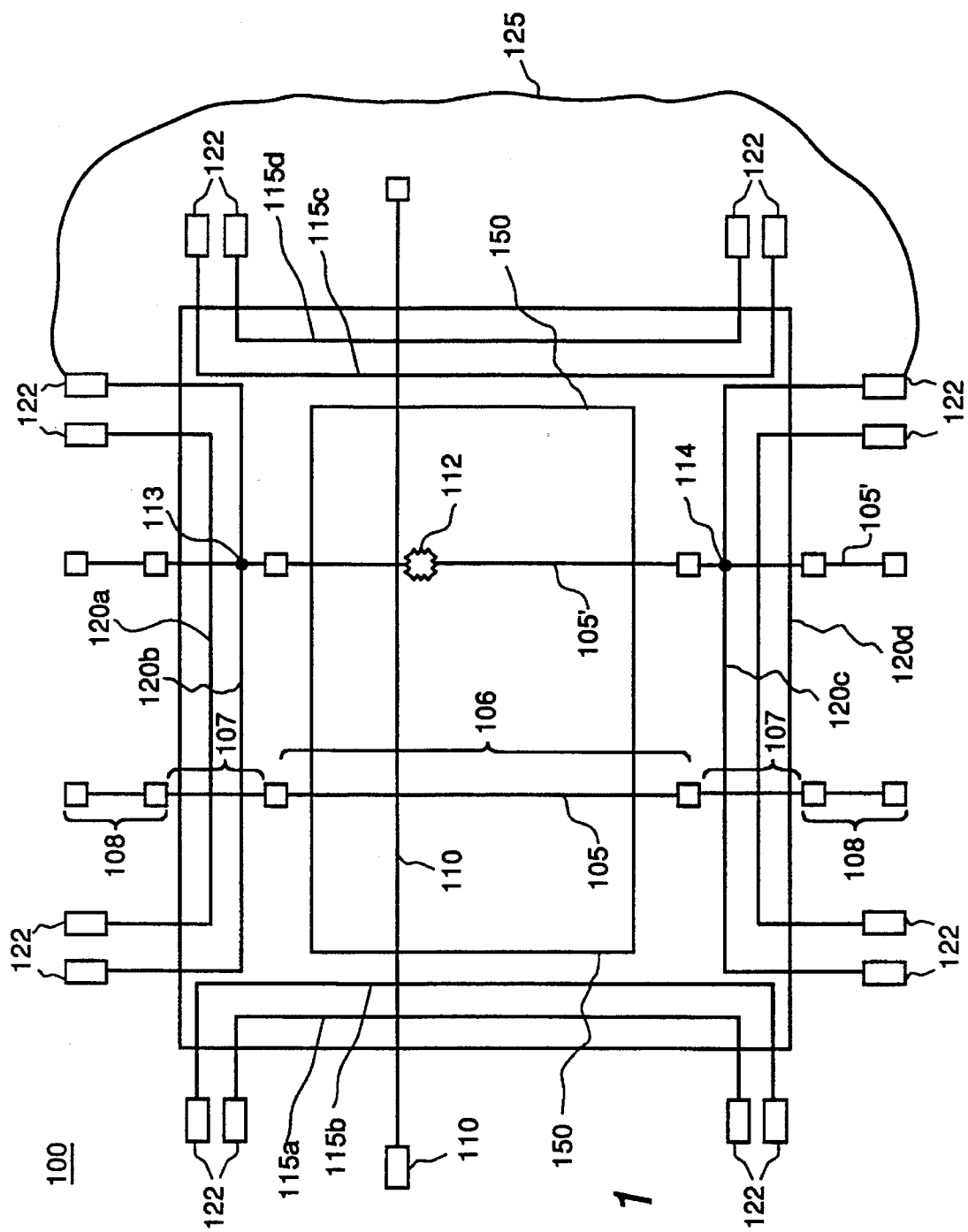
FIG. 1 is a schematic view of address lines and repair lines in an imager array.

One example of a repairable imager structure to which the present invention is applicable is illustrated in FIG. 1. A thin film electronic imager device 100 (FIG. 1), such as a solid state radiation imager, typically comprises a photosensor array having an active area 150 (such as where the photosensor pixels with devices sensitive to incident photons are disposed) and a plurality of address lines coupled to selective address respective ones of the pixels in the photosensor array. The address lines are electrically conductive and are disposed to form a matrix of crossing lines. For example, scan lines 110 (a representative one of which is illustrated in FIG. 1) are oriented along a first axis of the device and data lines 105 (a representative one of which is illustrated in FIG. 1) are oriented along a second axis, the second axis being substantially perpendicular to the first axis of the device, thus forming a matrix of transmission lines in the device. The scan and data lines are typically electrically insulated from one another by a dielectric layer (not shown in FIG. 1) disposed between them.

In the fabrication of the photosensor array in a typical imager device, scan lines are formed on the substrate; a dielectric layer is deposited over the array; semiconductive material is deposited and patterned to form the bodies of switching devices (not shown), such as a field effect transistor (FET) (also referred to as a thin film transistor (TFT)) associated with each pixel; conductive metal is deposited and patterned to form source and drain electrodes for each TFT and typically also for data lines in the array; semiconductive material for photodiodes is deposited and patterned; a common electrode is formed over the photodiodes. It is not uncommon in the fabrication process that certain defects, such as open circuits, develop in one or more address lines of the array. To increase yield, it is important that most of these defects be repairable.

In accordance with the present invention, imager device 100 further comprises at least one, and typically a plurality (e.g., between about 6 to 12) of auxiliary (also referred to as repair) lines 115, 120 (for ease of discussion, auxiliary lines oriented along the first axis (i.e., parallel to the scan lines 110) are identified with numeral 120 and auxiliary lines oriented along the second axis (i.e., parallel to data lines 105) are identified with numeral 115. Auxiliary lines 115, 120 are aligned along a respective axis oriented substantially parallel to a boundary of active area 150 near which they are disposed. Auxiliary lines 115, 120 are each coupled at each end to respective repair contact pads 122, their respective repair contact pads being disposed on the same side of device 100 as the lines themselves, as illustrated in FIG. 1. Auxiliary lines 115, 120 typically comprise a conductive material such as molybdenum, titanium, chromium, aluminum, or the like. With the exception of the orientation in the array, auxiliary lines 115 and 120 are essentially identical in structure.

In one embodiment of this invention, data lines 105 comprise a first portion 106 disposed from one side of active area 150 to the opposing side of the active area. At the respective edges of active area 150, each data line is coupled to a respective extension shunt 107 that is disposed in the photosensor array at substantially the same level as scan lines 110 (e.g., disposed on the substrate). Extension shunt 107 is coupled near the edge of imager device 100 to a contact finger 108 so that extension shunt 107 extends between the edge of active area 150 (the location of the terminus of data line) and the edge of the array. Electrical coupling between data line first portion 106 and extension shunt 107, and between extension shunt and contact finger 108 each is typically through vias formed in the array structure.

By way of example, and not limitation, a defect 112, such as an open circuit in data line 105', is repaired in device 100 by welding (e.g., by laser welding) one side of defective data line 105' to a first selected auxiliary line (line 120b as illustrated in FIG. 1) at a crossover region 113 where auxiliary line 120b crosses over data line 105' and welding the other side of defective data line 105' to a second selected auxiliary line (line 120c as illustrated in FIG. 1) at a second repair crossover region 114 where auxiliary line 120c crosses over data line 105. An electrically conductive jumper 125 coupled between respective repair contact pads 122 for auxiliary lines 120b and 120c allows an electrical signal applied at one contact finger 108' of data line 105' to be applied across the remaining conductive portions of defective data line 105'. Jumper 125 may be external to the imager panel of device 100, or, alternatively, jumper 125 may comprise an integral part (not shown) of device imager panel 100, such as an embedded conductive path electrically coupleable to respective auxiliary lines. A defect in a scan line 110 can be similarly repaired through the use of respective auxiliary lines 115 that cross over the defective scan line.

As a result of common fabrication techniques, data lines 105 and auxiliary lines 115, 120 are typically disposed in a vertical plane of the array over the topography of underlying components in the array, such as scan lines 110, semiconductive material used in formation of the switching transistors, or the like. As used herein, the terms "above", "upper", "under", and the like refer only to the relative position of the components in layers of the photosensor array with respect to the substrate on which the array is formed, and do not imply any limitation on the ultimate orientation of device 100. The auxiliary lines are disposed to substantially conform to (e.g., disposed on top of) the varying features of the surface topography of the underlying components.

At this relative vertical position in the array, the auxiliary lines are exposed to etchants and the like used in patterning steps for components, such as the photodiodes. These fabrication processes can result in damage to the conductive material comprising auxiliary lines 115, 120, causing, for example, open circuits (or "opens") along the auxiliary line or reduction in size of the auxiliary line such that a repair crossover region of sufficient size (e.g., about 10 μm by 10 μm is recommended to effectively weld the auxiliary line to the underlying conductive line) no longer exists at the crossover regions. The vulnerability of the exposed upper conductive line (e.g., the auxiliary line) to degradation is greatest in the repair crossover regions, that is, the respective areas in the device where the auxiliary lines 115 cross over (e.g., are in vertical alignment with) scan lines 110, or, in the case auxiliary lines 120, where the auxiliary lines pass over the respective extension shunts 107 of data lines 105. Damage to the auxiliary line is particularly evident at the edges of the upper conductive line where it is disposed over the sidewalls of underlying components (that is, where the auxiliary line bends to extend over changes in the contour of the surface topography); the damage can include degradation of the auxiliary line metal and degradation of the underlying dielectric material. In most conventional imager array devices, auxiliary lines 115, 120 are protected only by a relatively thin (e.g., between about 0.1 μm to 0.5 μm) layer of dielectric material such as silicon nitride, silicon oxide, or the like. This structure leaves the auxiliary lines 115, 120 vulnerable to attack, particularly at the edges (where the sidewall and top surface of the auxiliary line come together at steps in the line where it extends over the underlying topography) of these conductive lines.

Figure 2A:
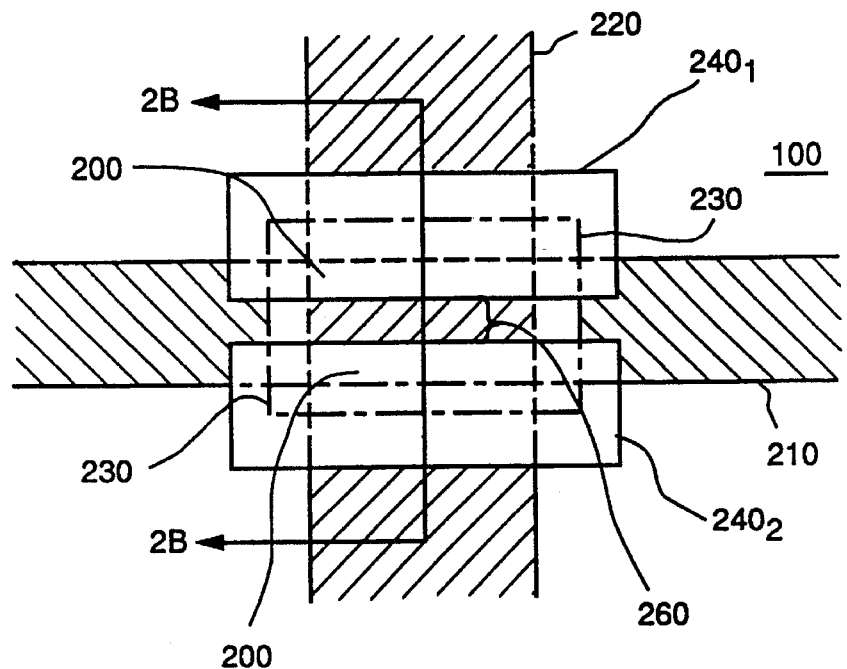
FIG. 2(A) is a plan view of a repair crossover area in accordance with one embodiment of the present invention.

In accordance with this invention, a first protective layer $240_1$ and a second protective layer $240_2$ are disposed on the upper conductive lines (e.g., the auxiliary lines 115, 120) in each repair crossover region 200 (FIG. 2(A)) in an imager device. As used herein, "repair crossover region" refers to the position in the photosensor array at which an auxiliary line is in vertical alignment with an underlying scan line, or alternatively, an auxiliary line is in vertical alignment with an underlying extension shunt 107 of a data line. As the basic structure is the same for each repair crossover region in the device, for purposes of illustration in FIGS. 2 the underlying, that is, scan line, is referred to as a first conductive line 210, and the overlying, that is, auxiliary line, is referred to as a second conductive line 220.

In the plan view of FIG. 2(A), an semiconductive material island 230 is disposed between first conductive line 210 and second conductive line 220. The typical width of first conductive line 210 is in the range between about 10 μm and 30 μm, and the typical width of second conductive line 220 is between about 10 μm and 30 μm. Semiconductive material island 230 typically is substantially centered on repair crossover region 200 and has dimensions in the range between about 20 μm by 20 μm to 50 μm by 50 μm, such that the lateral boundaries of semiconductive material island 230 extend beyond the area of vertical alignment of first and second conductive lines. First and second protective layers $240_1$, $240_2$, are disposed on respective sides of second conductive line 220 so as to leave a repair area 260 therebetween in the crossover repair region 200 in which second conductive line 220 is in vertical alignment with first conductive line 210. Repair area 260 provides an area sufficient to effect the laser welds, typically having an area between about 100 μm$^2$ and 1000 μm$^2$. To facilitate welding, it is desirable that the material comprising protective layers 240 not be disposed in repair area 260. In repair of an imager device, usually about 3 welds having a dimensions of about 10 μm$^2$ each are desired to ensure satisfactory electrical contact between the first and second conductive lines.

Figure 2B:
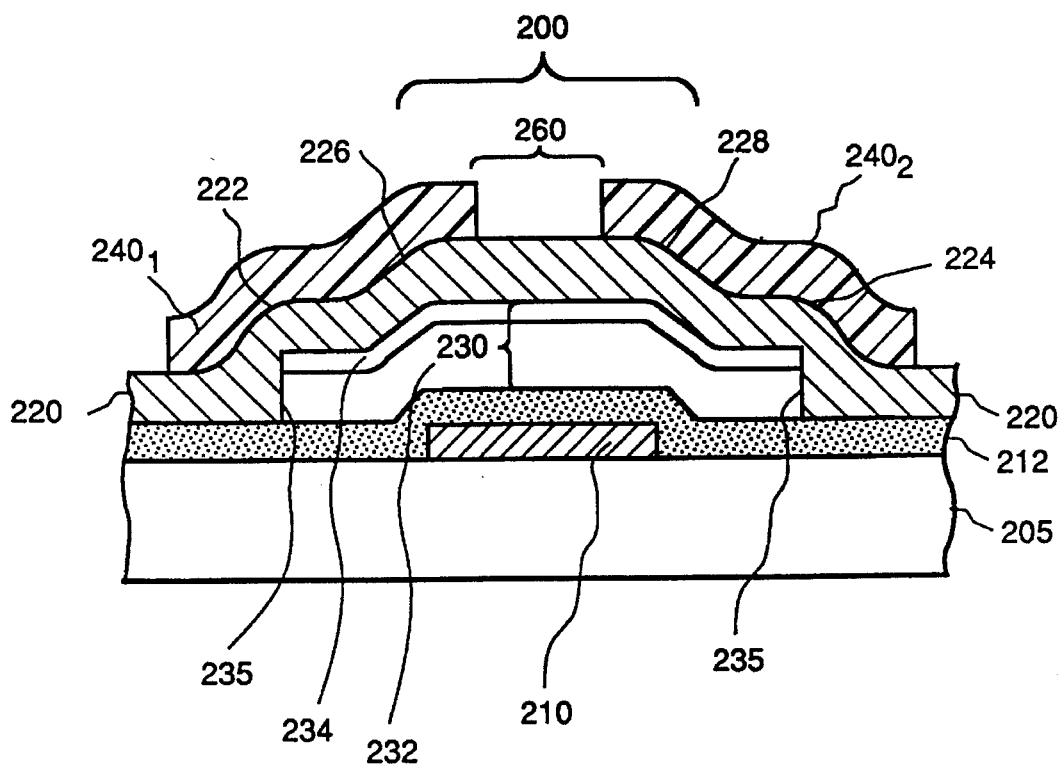
FIG. 2(B) is a cross sectional view of a repair crossover area taken along lines 2B—2B of FIG. 2(A).

FIG. 2(B) presents a cross-sectional view along the lines 2B—2B of the portion of imager device 100 illustrated in FIG. 2(A). First conductive line 210 is disposed on a substrate 205, comprising glass or the like. First conductive line comprises a conductive material such as chromium, molybdenum, titanium, aluminium, or the like. A dielectric layer 212 is disposed over first conductive lines 210 and typically comprises an inorganic dielectric material such as silicon nitride, silicon oxide, a combination of these material, or the like.

Semiconductive material island 230 is commonly disposed over first conductive line 210 in the vicinity of repair crossover region 200 and comprises semiconductive material of the type used in the fabrication of TFTs in the photosensor array (thereby enabling the semiconductive material island to be deposited and patterned simultaneously with the formation of the TFTs). Semiconductive material island 230 typically comprises a first layer 232 of intrinsic amorphous silicon, and a second layer 234 (in the regions underlying second conductive line 220) of amorphous silicon doped to exhibit n type conductivity. In regions of semiconductive material island 230 that do not underlie second conductive line 220, doped silicon layer 234 is typically removed as a result of processing steps in the fabrication of the photosensor array.

Second conductive line 220 is disposed such that it substantially conforms to the surface topography of semiconductive material island 230 as it passes over the semiconductive material island in repair crossover region 200. The bends, or steps, of second conductive line as it extends over the contour of the topography often are the site of intrinsic defects in the step coverage of the conductive metal that are most susceptible to damage from exposure to etchants later in the fabrication process because the overlying dielectric protective layers tend to be thinner over steps, and hence more prone to fail to protect the underlying step from damage during subsequent etching steps. Second conductive line 220 comprises a first step 222 in the vicinity where the conductive line adjoins a sidewall 235 on one side of semiconductive material island 230 and a second step 224 in the vicinity where the conductive line adjoins the opposite sidewall 235 of semiconductive material island 230. The topography of semiconductive material island further comprises a ridge that corresponds to the underlying first conductive line 210 (that is, a ridge where semiconductive material island 230 extends up and over the underlying first conductive line 210), and second conductive line 220 further comprises a third step 226 and a fourth step 228 in the vicinity where the conductive line extends over the ridge of semiconductive material island 230 generally above the edges of first conductive line 210.

In accordance with one embodiment of this invention, first protective layer $240_1$ is disposed to cover both first and third steps 222, 226, and second protective layer $240_2$ is disposed to cover both second and fourth steps 224, 228 of second conductive line 220. First and second protective layers 240 each typically comprise an inorganic dielectric material such as polyimide, which is typically deposited in a spin coating process to a thickness in the range between about 0.5 μm and 3 μm.

In this arrangement, protective layers 240 provide protection to the steps (that is, portions of the second conductive line having edges where it passes over underlying structures) at which the structural integrity of conductive line 220 is most subject to attack during fabrication processing steps for imager device 100, while still leaving repair area 260 with ample space in which laser ablation welds can be made readily between first and second conductive lines. For example, first and second protective layer 240 provide protection for the covered portions second conductive line 220 from reactive ion etchants such as HCl, Ar, $O_2$, acetone, or combinations thereof that are typically used in fabrication etching steps in the formation of the indium tin oxide photosensor array common electrode or removal of portions of passivation coatings on the array. Absent protective layers 240, the second conductive line is otherwise exposed to these etchants during the normal fabricating steps for the imager device.

Figure 3A:
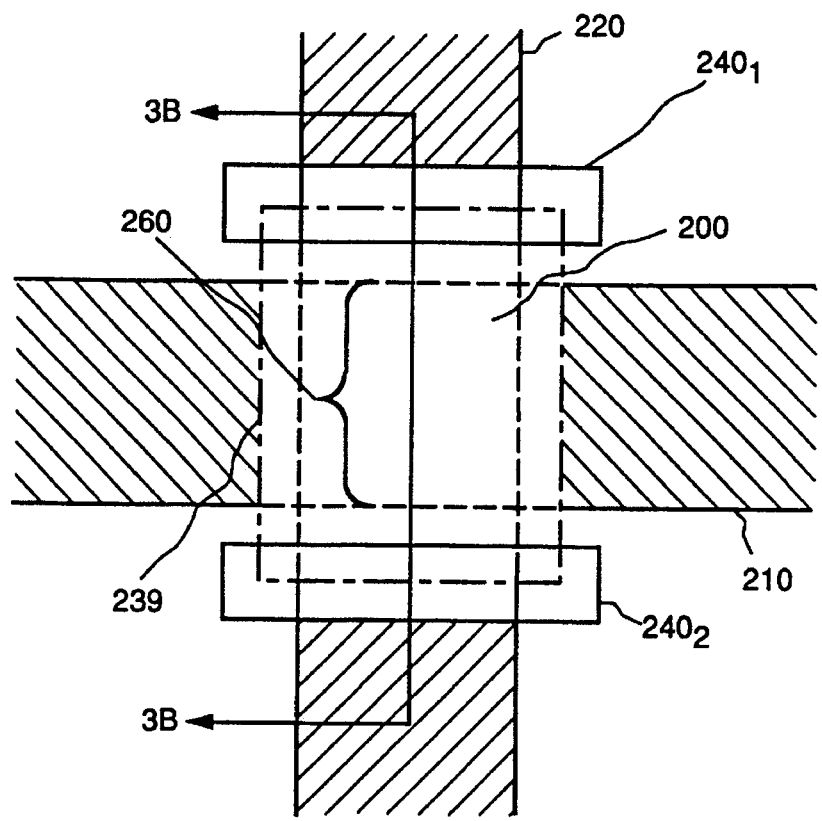
FIG. 3(A) is a plan view of a repair crossover area in accordance with another embodiment of the present invention.
Figure 3B:
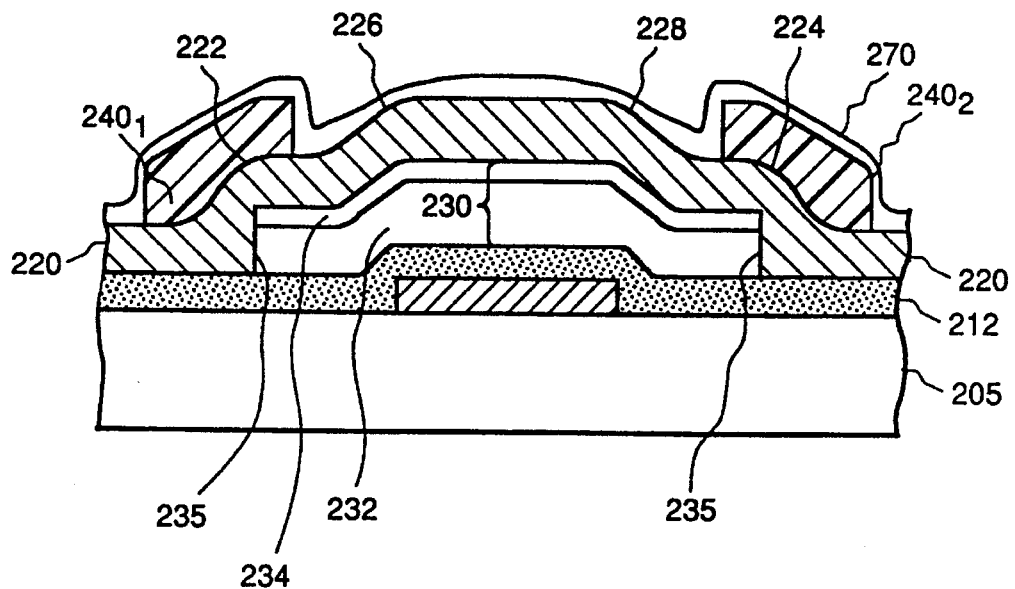
FIG. 3(B) is a cross sectional view of a repair crossover area taken along lines 3B—3B of FIG. 3(A).

Another embodiment of the present invention is illustrated in FIGS. 3(A) and 3(B), which illustrates a repair crossover region 200 in an imager device 100 that is the same as described above with respect to FIGS. 2(A) and 2(B), except as noted below. As illustrated in FIGS. 3(A) and 3(B), first protective layer $240_1$ is disposed so as to cover first step 222 of second conductive line 220 but does not extend to cover third step 226 of the second conductive line. Similarly, second conductive layer $240_2$ is disposed so as to cover second step 224 of second conductive line 220 but does not extend to cover fourth step 228 of the second conductive line. In this arrangement, protective layers 240 provide protection to the most critical (that is vulnerable to degradation as a result of exposure to subsequent processing steps) steps of second conductive line 220 while providing the largest available repair area 260 for laser ablation welds to be made between first and second conductive lines. First and second steps comprise the most vulnerable steps in second conductive line 220 due to the steep slope required for the conductive line to extend up and over sidewalls 235 of semiconductive material island 230 (e.g., the thickness of semiconductive material island at the sidewalls is in the range between about 0.3 μm to 0.6 μm, while the thickness of first conductive line 210 is typically about 0.1 μm to 0.3 μm).

A further embodiment of the present invention illustrated in FIG. 3(B) comprises a third protective layer 270 disposed over the array so as to cover at least both first and second protective layers 240 and the remaining portions of repair crossover region 200 (although shown for illustration purposes in FIG. 3(B), this embodiment of the invention is equally applicable to the structure of first and second protective layers illustrated in FIGS. 2(A) and 2(B)). Third protective layer 270 typically comprises an inorganic dielectric material, such as silicon nitride or the like, and typically has a thickness in the range between about 0.1 μm and 2 μm. Third protective layer 270 provides further protection of the repair crossover region, second conductive line 220, and first and second protective layer from attack during removal of the silicon nitride from the repair crossover region, usually by dry etching using a combination of $CF_4$, $O_2$, $SF_6$, and $Cl_2$.

Figure 4:
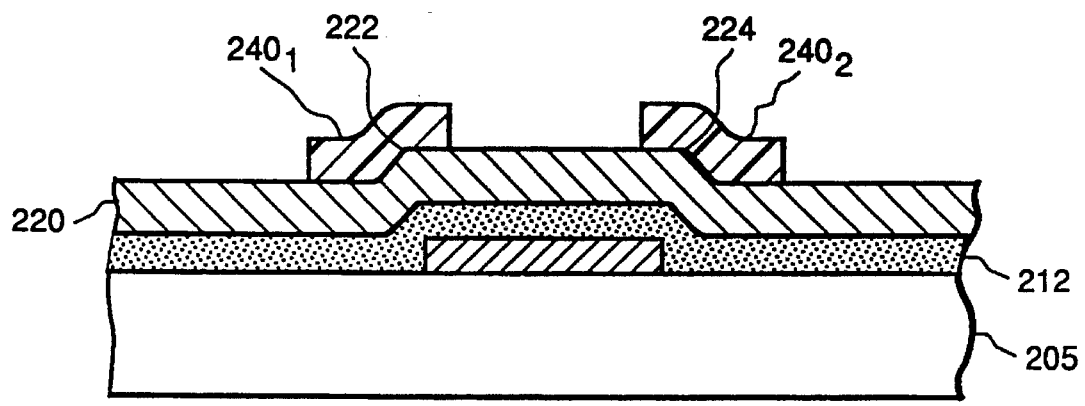
FIG. 4 is a cross sectional view of a repair crossover area in accordance with another embodiment of the present invention.

Another embodiment of this invention is illustrated in FIG. 4, which illustrates a repair crossover region 200 in an imager device 100 that is the same as described above with respect to FIGS. 2(A) and 2(B), except as noted below. In this embodiment, no semiconductive material island 230 is disposed in repair crossover region. Thus, the surface topography in this region comprises the contour of dielectric layer 212 where that layer extends over the underlying first conductive line 210; protective layers $240_1$ and $240_2$ are disposed on first and second steps 222, 224 of second conductive line 220 where the conductive line extends over the contour of dielectric layer 220.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A thin film electronic imager device having a pixel array structure fabricated on a substrate, said pixel array structure comprising:

a first electrically conductive line disposed along a first axis of said imager device;

a dielectric layer disposed on said substrate and over said first electrically conductive line;

a second electrically conductive line disposed along a second axis of said imager device, said second axis being oriented substantially perpendicular to said first axis, said second conductive line being disposed in said imager device in vertical alignment with said first conductive line at a respective crossover region with said dielectric layer disposed therebetween;

a semiconductive island disposed in said crossover region between said dielectric layer and said second conductive line, the lateral limits of said semiconductive island extending beyond the boundaries of said crossover region;

said second conductive line substantially conforming to the topography of underlying components disposed on said substrate such that said second conductive line comprises a plurality of steps disposed in correspondence with locations where said second conductive line extends over said topography; and a first protective layer and a second protective layer disposed over respective selected steps in said second conductive line, said first and second protective layers being separated by a repair area disposed therebetween at a portion of said second conductive line disposed in vertical alignment with said first conductive line.

2. The device of claim 1 wherein said respective first and second protective layers each comprise an organic dielectric material.

3. The device of claim 2 wherein said second conductive line comprises first and second steps disposed in correspondence with opposite sidewalls of said dielectric layer where said dielectric layer extends over said first electrically conductive line.

4. The device of claim 3 wherein said first and second protective layers are disposed so as to cover the outer edges of said first and second steps respectively.

5. The device of claim 4 wherein said second conductive line further comprises a third and a fourth step disposed in correspondence with opposite sides of said semiconductive island where said second conductive line extends over the sidewalls of said semiconductive island.

6. The device of claim 5 wherein said first protective layer is disposed over said first and third steps of said second conductive line, and said second protective layer is disposed over said second and fourth steps of said second conductive line.

7. The device of claim 5 wherein said first protective layer is disposed to cover said third step of said second conductive line without covering said first step of said second conductive line, and said second protective layer is disposed to cover said fourth step of said second conductive line without covering said second step of said second conductive line.

8. The device of claim 2 wherein said organic dielectric material comprises polyimide.

9. The device of claim 8 wherein the thickness of polyimide disposed in each of said first and second protective layers is in the range between about 0.5 μm and 2.5 μm.

10. The device of claim 2 wherein said first and second protective layers are disposed such that said repair area has an area in the range between about 100 μm$^2$ and 1000 μm$^2$.

11. The device of claim 14 wherein said semiconductive island comprises silicon.

12. The device of claim 11 wherein said semiconductive island comprises material corresponding to semiconductive material comprising field effect transistors disposed in said imager device.

13. The device of claim 1 wherein the area of said crossover region is between about 100 μm$^2$ and 1600 μm$^2$.

14. The device of claim 1 further comprising a third protective layer disposed over said first and second protective layers and said repair area, said third protective layer comprising an inorganic dielectric material.

15. The device of claim 14 wherein said third protective layer comprises silicon nitride.

16. The device of claim 15 wherein said silicon nitride third protective layer has a thickness in the range between about 0.1 μm and 1.5 μm.

* * * * *